United States Patent
Hur et al.

(10) Patent No.: US 7,410,552 B2
(45) Date of Patent: Aug. 12, 2008

(54) ELECTRON CYCLOTRON RESONANCE EQUIPMENT WITH VARIABLE FLARE ANGLE OF HORN ANTENNA

(75) Inventors: Ji-Hyun Hur, Seongnam-si (KR);
Jai-Kwang Shin, Anyang-si (KR);
Jae-Joon Oh, Seongnam-si (KR)

(73) Assignee: Samsung Electronics Co., Ltd (KR)

( * ) Notice: Subject to any disclaimer, the term of this patent is extended or adjusted under 35 U.S.C. 154(b) by 378 days.

(21) Appl. No.: 11/007,878

(22) Filed: Dec. 9, 2004

(65) Prior Publication Data

US 2005/0160986 A1 Jul. 28, 2005

(30) Foreign Application Priority Data

Dec. 10, 2003 (KR) .................. 10-2003-0089738

(51) Int. Cl.
*C23C 16/00* (2006.01)
*C23F 1/00* (2006.01)
*H01L 21/306* (2006.01)

(52) U.S. Cl. .................. 156/345.41; 156/345.46; 118/723 MW

(58) Field of Classification Search ......... 118/723 MW, 118/723 MR, 723 MA; 156/345.42
See application file for complete search history.

(56) References Cited

U.S. PATENT DOCUMENTS 5,228,052 A 7/1993 Kikuchi et al.
5,389,153 A * 2/1995 Paranjpe et al. ....... 118/723 MP
5,520,771 A * 5/1996 Kanai et al. ............. 156/345.41
5,869,802 A * 2/1999 Spencer et al. ......... 219/121.48
5,888,414 A 3/1999 Collins et al.
6,087,614 A * 7/2000 Ishizuka et al. ......... 219/121.43
6,311,638 B1 * 11/2001 Ishii et al. ............ 118/723 MW
6,646,224 B2 * 11/2003 Ishii et al. .............. 219/121.43

FOREIGN PATENT DOCUMENTS

JP 05-295544 * 9/1993

\* cited by examiner

*Primary Examiner*—Parviz Hassanzadeh
*Assistant Examiner*—Rakesh K Dhingra
(74) *Attorney, Agent, or Firm*—The Farrell Law Firm, PC

(57) ABSTRACT

An electron cyclotron resonance equipment generates plasma by application of a processing gas and microwave energy into a vacuum chamber having a wafer therein in an environment of reduced pressure. The equipment includes a horn antenna assembly mounted onto an uppermost end of the vacuum chamber for radiating the microwave energy supplied from a high-frequency generator into the vacuum chamber. The horn antenna enables extension and retraction in a lengthwise direction to change a flare angle of the horn antenna. The equipment is provided with a fixed antenna and a plurality of mobile antennas to configure a horn antenna assembly, thereby enabling control of the flare angle in the horn antenna as a result of displacement of the mobile antennas. Thus, the uniformity in radiation of the microwave energy within plasma chamber can be controlled with efficiency.

3 Claims, 2 Drawing Sheets

ELECTRON CYCLOTRON RESONANCE EQUIPMENT WITH VARIABLE FLARE ANGLE OF HORN ANTENNA

PRIORITY

This application claims priority under 35 U.S.C. § 119 to an application entitled "Electron Cyclotron Resonance Equipment with Variable Flare Angle of Horn Antenna" filed in the Korean Intellectual Property Office on Dec. 10, 2003 and assigned Serial. No. 2003-89738, the contents of which are incorporated herein by reference.

BACKGROUND OF THE INVENTION

1. Field of the Invention

The present invention relates generally to an apparatus for forming or working a thin layer onto a wafer surface and, in particular, to such an apparatus for depositing, etching and/or ashing of thin layers onto the wafer surface by generating plasma using electron cyclotron resonance equipment.

2. Description of the Related Art

Deposition of thin layers onto a wafer surface may be performed using various existing methods for various purposes during the manufacturing of precision equipments in this field, one of which known methods may be referred to, for example, as plasma chemical vapor deposition (CVD) process using electron cyclotron resonance equipment.

For example, referring to a silicon thin layer deposition using the plasma CVD process, silane gas is mixed with hydrogen gas to provide reaction gas and a high frequency electric power is then applied to an electrode facing the wafer surface in the reaction gas. Once the high frequency electric power is applied into the reaction gas, the reaction gas dissociates to form an amorphous silicon thin layer on the wafer surface.

In a similar manner, formation of a silicon oxide layer on a wafer surface may be achieved by applying the high frequency electric power to a mixture of silicon-based gas such as silane gas, and oxygen-based gas such as $N_2O$, oxygen gas, etc. and then dissociating the mixture gas.

An apparatus for etching a thin layer formed on a wafer is disclosed, for example, in U.S. Pat. No. 5,888,414 issued to Collins et al., wherein a plasma reactor chamber uses an antenna driven by high frequency energy, such as radio frequency (RF) energy that is inductively coupled within the reactor dome and the antenna generates a high density, low energy plasma within the chamber for etching oxygen-containing layers.

A plasma ashing apparatus for removing a resist film from a wafer surface is disclosed in U.S. Pat. No. 5,228,052 to Kikuchi et al., which discloses a vacuum treatment chamber for receiving therein a substrate coated with the resist film, and two electrodes disposed in parallel to each other.

The above-mentioned wafer treatment apparatuses utilizing plasma are conventionally disposed within a processing room within which about 2.45 GHz frequency of microwave is radiated onto an object material to be processed, e.g., a semiconductor wafer or a liquid crystal display (LCD) substrate in a reduced-pressure environment by a vacuum pump, while the reaction gas is introduced into the processing room such that the microwave radiation effects plasmarization of the reaction gas. Therefore, a part of the reaction gas could be formed into active radicals and active ions, that subsequently react on the object material to be processed to effect depositing, etching or ashing of a thin film.

In the prior art, a conventional antenna has been utilized to provide the object material with radiation of the RF microwave energy within the processing room of conventional electron cyclotron resonance equipment. However, because this type of antenna equipped with existing electron cyclotron resonance equipment usually can not control the microwave radiation pattern of the electron cyclotron resonance equipment, the antenna will still have a problem in that uniformity of microwave energy is substantially not controllable by an operator.

SUMMARY OF THE INVENTION

It is, therefore, an object of the present invention to provide electron cyclotron resonance equipment with a horn antenna assembly capable of controlling the uniformity of microwave energy for generating plasma.

To achieve the above and other objects of the present invention, there is provided an electron cyclotron resonance equipment for generating plasma by application of a processing gas and microwave energy into a vacuum chamber within which a wafer to be processed is arranged, in an environment of reduced pressure, comprising a horn antenna assembly mounted onto an uppermost end of the vacuum chamber for radiating the microwave energy supplied from a high-frequency generator into the vacuum chamber, the horn antenna assembly being extended and retracted in a lengthwise direction to change a flare angle of the horn antenna assembly.

According to on aspect of the present invention, in the electron cyclotron resonance equipment, the horn antenna assembly comprises a fixed antenna having a loop shape fixedly mounted onto an uppermost end of the vacuum chamber, and at least two mobile antennas each having a loop shape, each of the mobile antennas being installed, overlapping each other, within an inner periphery of the fixed antenna to substantially match an inner peripheral surface of the fixed antenna or an outer peripheral surface of at least two mobile antennas, wherein the mobile antennas move slidably in the lengthwise direction of the fixed antenna.

Preferably, the horn antenna assembly extends upwardly in the lengthwise direction by sliding movement of the mobile antennas from an overlapped position of the mobile antennas within the inner periphery of the fixed antenna.

More preferably, a flare angle of the horn antenna assembly is controlled as the mobile antennas extend in the lengthwise direction by sliding movement from the overlapped position within the fixed antenna.

BRIEF DESCRIPTION OF THE DRAWINGS

The above and other features and advantages of the present invention will be apparent from the following detailed description of a preferred embodiment as illustrated in the accompanying drawings, wherein the same reference characters refer to the same parts or components throughout the various views, and wherein.

DETAILED DESCRIPTION OF THE PREFERRED EMBODIMENT

In the following description, for purposes of explanation rather than limitation, specific details are set forth in order to provide a thorough understanding of the present invention. However, it will be apparent to those skilled in the art that the present invention may be practiced in other embodiments, that depart from these specific details. For the purpose of simplicity and clarity where they are well known in the art, detailed descriptions of well-known devices and methods are omitted.

Figure 1:
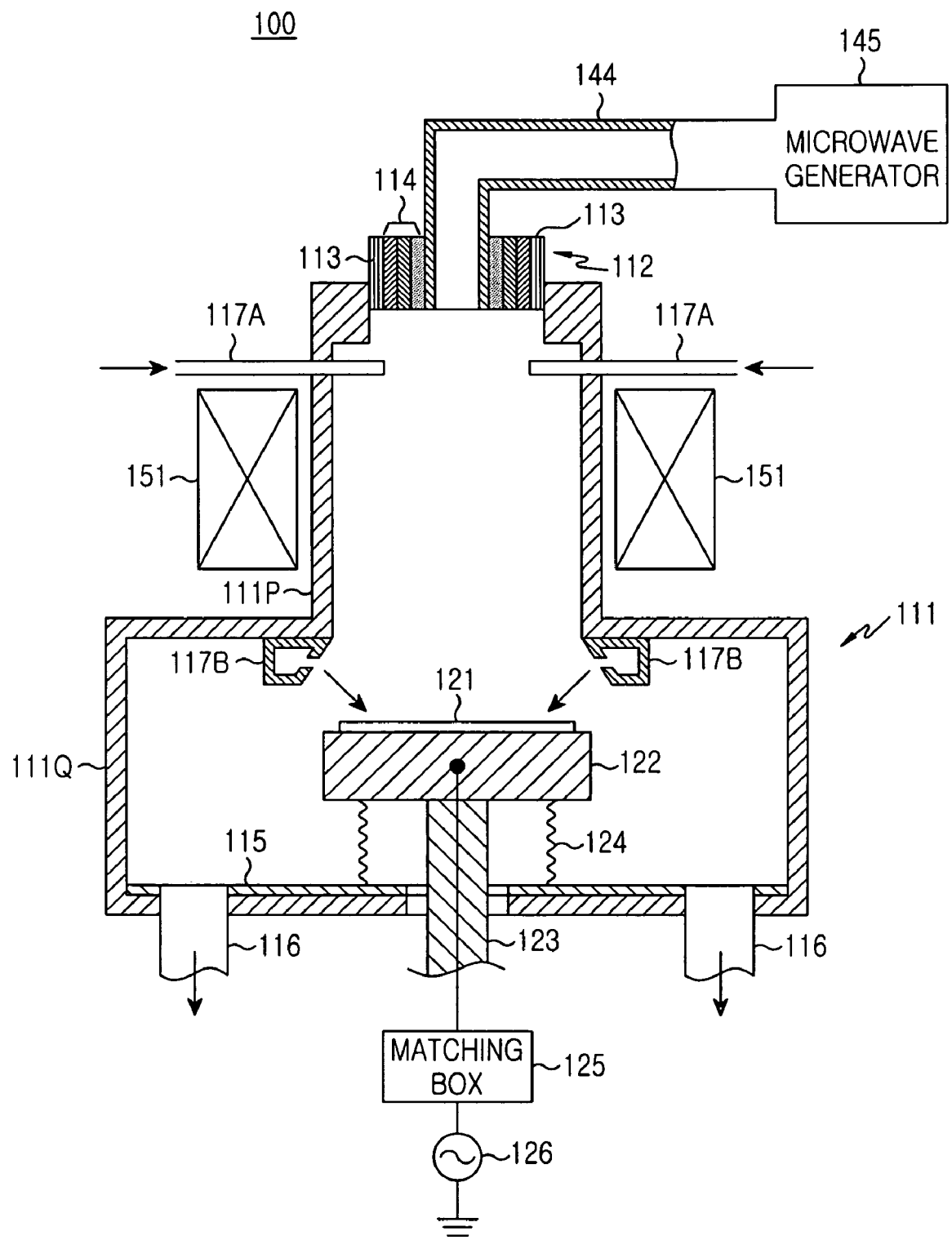
FIG. 1 is a cross-sectional schematic view illustrating an arrangement of an electron cyclotron resonance equipment according to a preferred embodiment of the present invention.
Figure 2:
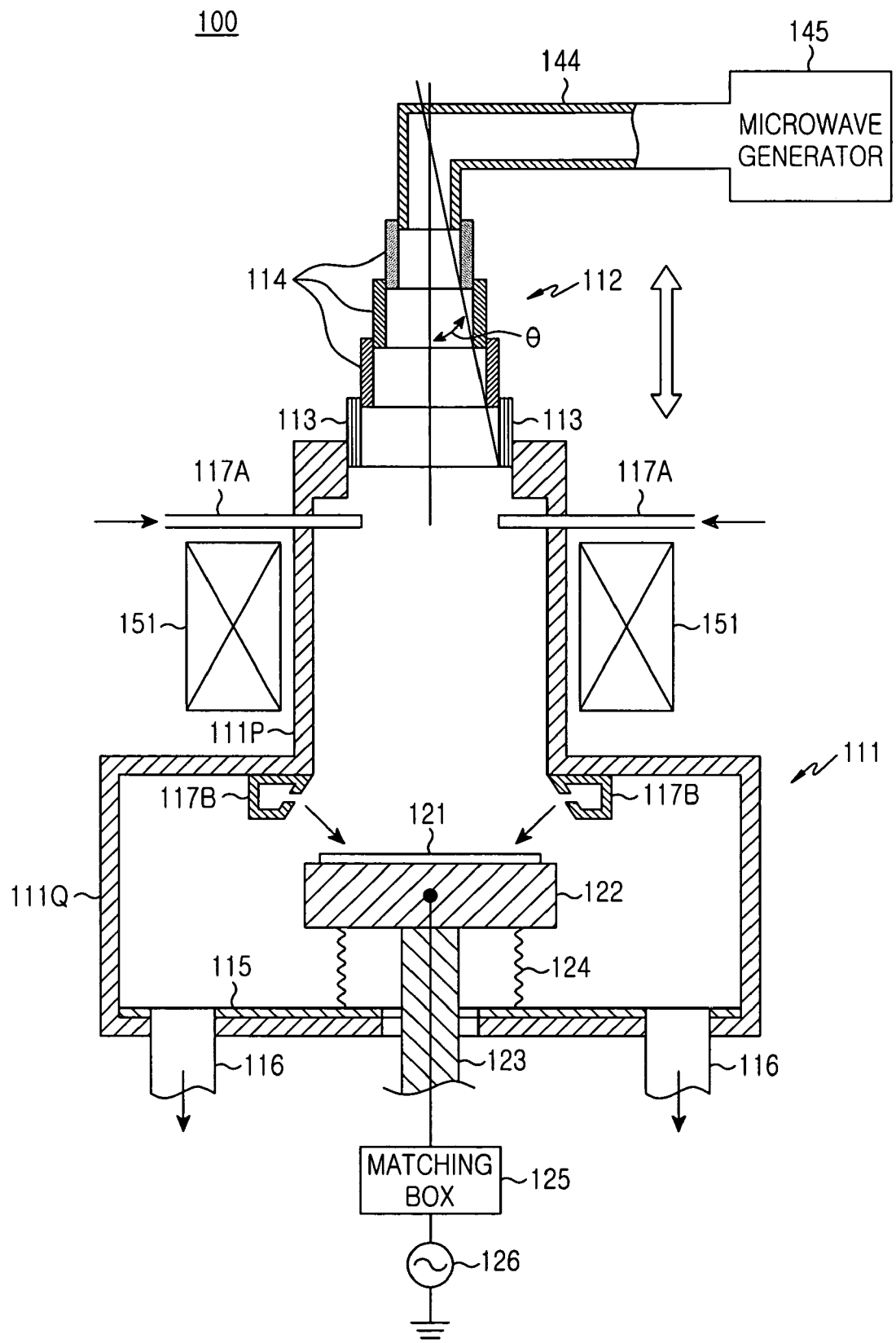
FIG. 2 is a cross-sectional schematic view illustrating the arrangement of the electron cyclotron resonance equipment, as shown in FIG. 1, with a horn antenna extended according to a preferred embodiment of the present invention.

Referring to FIG. 1, description will be made on the electron cyclotron resonance (hereinafter, referred to as ECR) equipment 100 according to a preferred embodiment of the present invention. Referring then to FIG. 2, the electron cyclotron resonance equipment 100, as illustrated in FIG. 1, will be described with a horn antenna 112 extended. Preferably, the ECR equipment 100 may be a part of a plasma etching device.

The ECR equipment 100 includes a vacuum chamber 111, a horn antenna assembly 112 and a microwave generator 145. The vacuum chamber 111 is partitioned into a plasma chamber 111P having installed about its periphery electric coils 151 for formation of electromagnetic field, and a reactor chamber 111Q having disposed therein a set of wafers 121 to be processed. Through a side wall of the plasma chamber 111P are disposed gas supply nozzles 117A for introduction of plasma gas such as argon (Ar). In an uppermost inner end of the reactor chamber 111Q is arranged at least one annular gas supply 117B for introduction of etching gas such as carbon tetrafluoride ($CF_4$).

The horn antenna assembly 112 is secured to a bore in an upper part of the plasma chamber 111P. The horn antenna assembly 112 is connected via a waveguide 144 to the microwave generator 145. Using the waveguide 144 and the microwave generator 145, the ECR equipment 100 provides an electromagnetic field supply means.

On a bottommost wall of the reactor chamber 111Q is formed an insulating plate 115 preferably consisting of ceramic material or any other insulator. At least one exit 116 is arranged to extend through the bottommost wall of the reactor 111Q and the insulating plate 115, and the exit 116 extends to communicate with a vacuum pump (not shown) for reducing in pressure within the reactor chamber 111Q or for keeping the inside of the reactor chamber 111Q in a vacuum state, to control the environmental requirements needed for wafer processing.

Within the reactor chamber 111Q is accommodated a cylinder-type wafer processing die 122 on which the wafer workpiece 121 is arranged for processing. The wafer processing die 122 is supported by a supporting rod 123 to move upwardly or downwardly in a perpendicular direction within the reactor chamber 111Q. To the wafer processing die 122 is coupled a radio frequency (RF) electric power source 126 for bias through a matching box 125. An output frequency of the RF power source 126 may be within a range from hundreds of kHz to tens of MHz. In order to provide an airtight connection in the reactor. chamber 111Q, a bellows 124 is installed around the supporting rod 123 extending between the wafer processing die 122 and the insulating plate 115.

According to the ECR equipment 100 as mentioned in the above, about 2.45 GHz of RF energy is preferably radiated to the reaction gas introduced into the plasma chamber 111P to make the reaction gas within the plasma chamber 111P into plasma. This plasma reaction gas is supplied to the reactor chamber 111Q in the environment of reduced pressure or in vacuum state for further processing for depositing, etching and/or ashing onto wafers 121.

The horn antenna assembly 112 includes a fixed antenna 113 fixedly mounted on an uppermost end of the vacuum chamber 111, more specifically, the plasma chamber 111P, and at least two mobile antennas 114 disposed in overlapping relationship with wave guide 144 within the fixed antenna 113. The mobile antennas 114 are preferably concentrically arranged with respect to the fixed antenna 113 and the wave guide 144, as well as with each other. The fixed antenna 113 may be preferably a circular- or polygonal-shaped loop antenna, extending from the uppermost end of the plasma chamber 111P to a predetermined length in a substantially perpendicular direction, and the mobile antennas 114 also may be a circular- or polygonal-shaped loop antenna, extending up to a predetermined length in a substantially perpendicular direction and overlapped by the fixed antenna 113. The mobile antenna 114 is positioned to contact with an inner side surface of the fixed antenna 113 or the other mobile antenna and slide thereon, wherein both the fixed antenna and the mobile antenna are more preferably circular-shaped loop antennas.

In particular, as shown in FIG. 1, a set of the mobile antennas 114 are interposed between the opposing inner ends of the fixed antennas 113, to overlap each other, wherein each mobile antenna 114 moves slidably in telescopic fashion in a lengthwise direction, contacting with an inner end surface of the fixed antenna 113 or the respective adjacent mobile antennas 114. Hence, upward sliding movement of the mobile antennas 114 creates the horn antenna assembly 112 to extend in the lengthwise direction. A flare angle (θ), as illustrated in FIG. 2, of the horn antenna assembly 112 from which the RF microwave energy is radiated is controllable as a result of the movement of the mobile antennas 114 and the distance of extension. As the flare angle in the horn antenna assembly 112 can be controlled as desired, the uniformity in radiation of the RF microwave energy is also controllable with ease and efficiency. The flare angle (θ) may also be modified depending on the number of mobile antennas 114, which are shown as being two antennas, but may be as few as one or may include a plurality of movable antennas.

As understood from the foregoing description, the electron cyclotron resonance equipment according to the present invention is provided with a fixed antenna and a plurality of mobile antennas to configure a horn antenna set for use in radiation of microwave energy within the plasma chamber, thereby enabling control of the flare angle in the horn antenna as a result of displacement of the mobile antennas. As a result, the uniformity in radiation of the microwave energy within the plasma chamber can be controlled with ease and efficiency.

While the preferred embodiments of the present invention have been illustrated and described, it will be understood by those skilled in the art that various changes and modifications may be made, and equivalents may be substituted for elements thereof without departing from the true scope of the present invention. Therefore, it is intended that the present invention not be limited to the particular embodiment disclosed as the best mode contemplated for performing the present invention; instead, it is intended that the present invention include all embodiments falling within the scope of the appended claims.

What is claimed is:

1. An electron cyclotron resonance equipment for generating plasma by application of a processing gas and microwave energy into a vacuum chamber within which a wafer to be processed is arranged, in an environment of reduced pressure, comprising:

a horn antenna assembly mounted onto an uppermost end of the vacuum chamber for radiating the microwave energy supplied from a high-frequency generator into the vacuum chamber, the horn antenna assembly being telescopically extendable and retractable in a lengthwise direction and moving slidably between an overlapped position and an extended position, the extended position being above the overlapped position.

2. The electron cyclotron resonance equipment as set forth in claim 1, wherein the horn antenna assembly comprises a fixed antenna having a loop shape fixedly mounted onto the uppermost end of the vacuum chamber, and at least two mobile antennas each having a loop shape, each of the mobile antennas being installed in overlapping relation to each other within an inner periphery of the fixed antenna, and the mobile antennas moving slidably in the lengthwise direction of the fixed antenna.

3. The electron cyclotron resonance equipment as set forth in claim 2, wherein the horn antenna assembly extends upwardly in the lengthwise direction by sliding movement of the mobile antennas within the fixed antenna.

* * * * *